United States Patent
Divakaruni et al.

(10) Patent No.: US 10,002,876 B2
(45) Date of Patent: Jun. 19, 2018

(54) FINFET VERTICAL FLASH MEMORY

(71) Applicant: International Business Machines Corporation, Armonk, NY (US)

(72) Inventors: Ramachandra Divakaruni, Ossining, NY (US); Arvind Kumar, Chappaqua, NY (US); Carl J. Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 14/527,256

(22) Filed: Oct. 29, 2014

(65) Prior Publication Data

US 2016/0126249 A1    May 5, 2016

(51) Int. Cl.
*H01L 21/8242* (2006.01)
*H01L 27/11568* (2017.01)
(Continued)

(52) U.S. Cl.
CPC .. *H01L 27/11568* (2013.01); *H01L 21/28282* (2013.01); *H01L 21/823431* (2013.01);
(Continued)

(58) Field of Classification Search
CPC ........... H01L 27/11568; H01L 27/0886; H01L 21/823431; H01L 21/11575;
(Continued)

(56) References Cited

U.S. PATENT DOCUMENTS

| | | | | |
|---|---|---|---|---|
| 4,140,558 A | * | 2/1979 | Murphy | H01L 21/743 257/517 |
| 6,114,725 A | * | 9/2000 | Furukawa | H01L 27/10808 257/296 |

(Continued)

FOREIGN PATENT DOCUMENTS

EP    2026378 A3    2/2009

OTHER PUBLICATIONS

Chung et al. "N-channel versus p-channel flash eeprom—which one has better reliabilities" in 39th Annual International Reliability Physics Symposium 2001. pp. 67-72. Published by IEEE in 2001.*

(Continued)

*Primary Examiner* — Jesse Y Miyoshi
*Assistant Examiner* — Tuan A Hoang
(74) *Attorney, Agent, or Firm* — Scully, Scott, Murphy & Presser, P.C.; Steven J. Meyers

(57) ABSTRACT

A plurality of fin structures containing, from bottom to top, a non-doped semiconductor portion and a second doped semiconductor portion of a first conductivity type, extend upwards from a surface of a first doped semiconductor portion of the first conductivity type. A trapping material (e.g., an electron-trapping material) is present along a bottom portion of sidewall surfaces of each non-doped semiconductor portion and on exposed portions of each first doped semiconductor portion. Functional gate structures straddle each fin structure. Metal lines are located above each fin structure and straddle each functional gate structure.

(Continued)

Each metal line is orientated perpendicular to each functional gate structure and has a bottommost surface that is in direct physical contact with a portion of a topmost surface of each of the second doped semiconductor portions.

10 Claims, 7 Drawing Sheets

(51) Int. Cl.
    *H01L 27/088*     (2006.01)
    *H01L 21/8234*     (2006.01)
    *H01L 21/28*     (2006.01)
    *H01L 27/12*     (2006.01)
    *H01L 29/40*     (2006.01)
    *H01L 29/792*     (2006.01)
    *H01L 29/66*     (2006.01)

(52) U.S. Cl.
    CPC ...... *H01L 27/0886* (2013.01); *H01L 27/1203* (2013.01); *H01L 29/408* (2013.01); *H01L 29/66833* (2013.01); *H01L 29/792* (2013.01); *H01L 29/7926* (2013.01)

(58) Field of Classification Search
    CPC ......... H01L 29/41791; H01L 29/42392; H01L 29/785–29/7856; H01L 21/761; H01L 21/762; H01L 21/76224
    See application file for complete search history.

(56) References Cited

U.S. PATENT DOCUMENTS

| | | | |
|---|---|---|---|
| 6,420,232 B1* | 7/2002 | Wu | H01L 27/11526 257/298 |
| 6,657,252 B2 | 12/2003 | Fried et al. | |
| 7,087,952 B2 | 8/2006 | Zhu et al. | |
| 7,271,052 B1* | 9/2007 | Forbes | H01L 27/10802 257/296 |
| 7,416,941 B2 | 8/2008 | Anderson et al. | |
| 7,619,276 B2 | 11/2009 | Zhu | |
| 7,745,287 B2* | 6/2010 | Choi | H01L 27/11568 257/302 |
| 7,811,889 B2 | 10/2010 | Trivedi et al. | |
| 7,879,677 B2 | 2/2011 | Lee | |
| 8,575,672 B2* | 11/2013 | Song | H01L 27/115 257/314 |
| 8,576,672 B1* | 11/2013 | Peng | G11B 5/7325 369/13.01 |
| 2007/0122979 A1* | 5/2007 | Oh | H01L 21/28282 438/261 |
| 2008/0290399 A1* | 11/2008 | Levy | H01L 21/28282 257/324 |
| 2009/0200603 A1* | 8/2009 | Ogura | H01L 21/28282 257/326 |
| 2012/0281478 A1* | 11/2012 | Lue | H01L 21/28273 365/185.18 |

OTHER PUBLICATIONS

Chung et al. "N-channel versus p-channel flash EEPROM—which one has better reliabilities" in Annual International Reliability Physics Symposium 2001, pp. 67-72. Published by IEEE in 2001.*

* cited by examiner

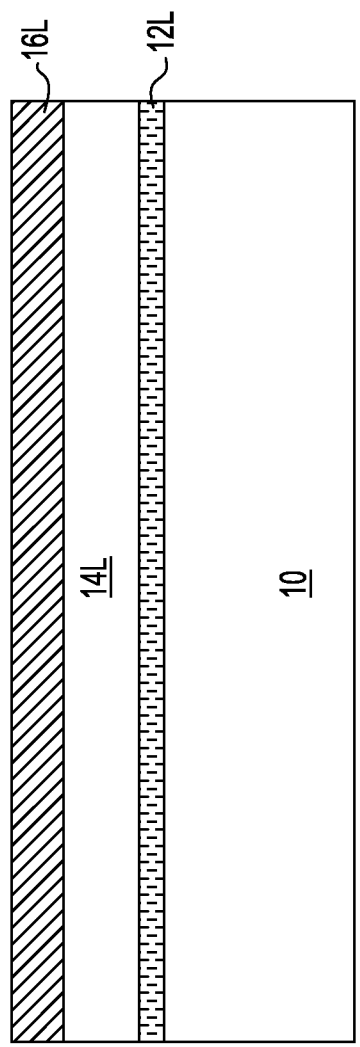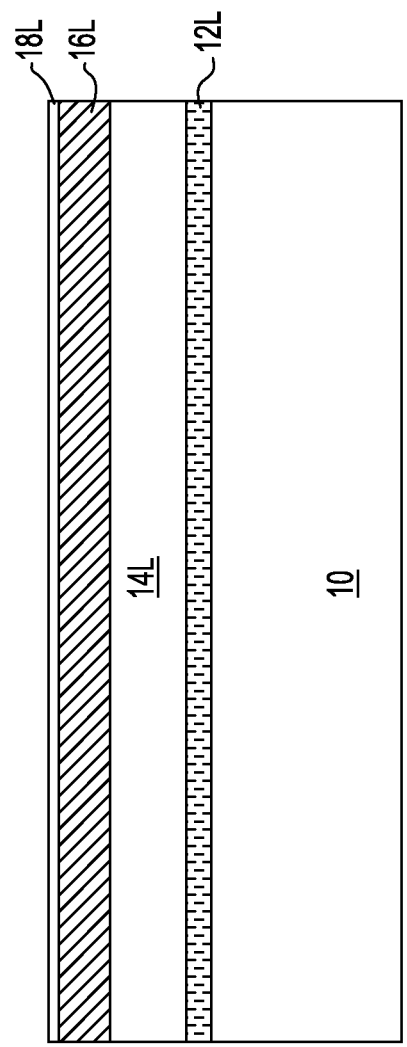

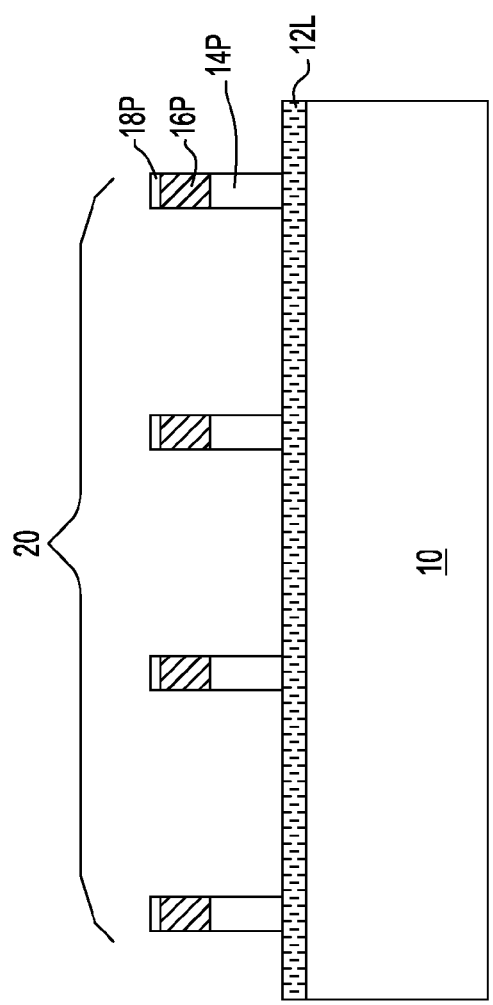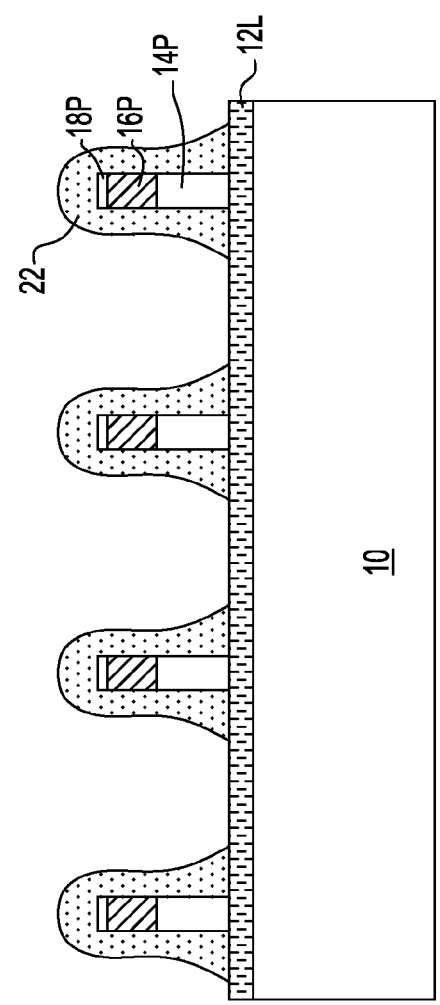

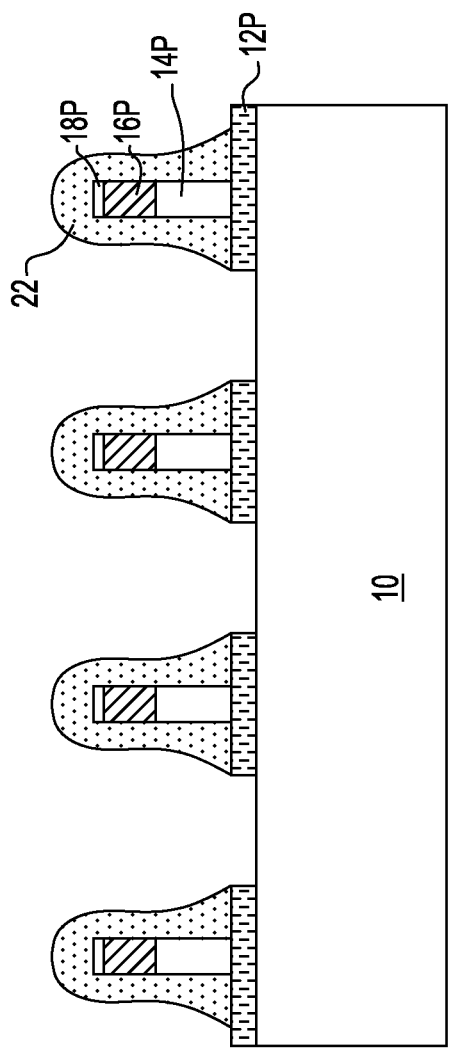
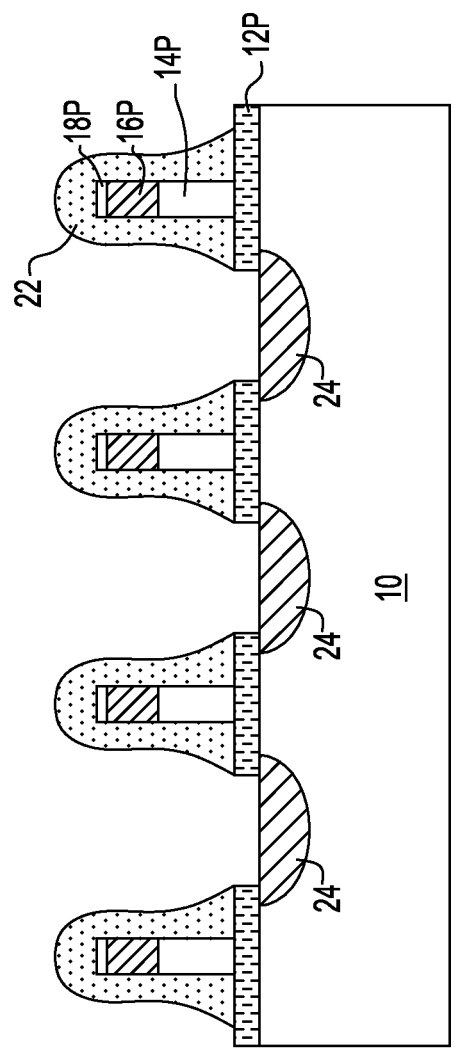

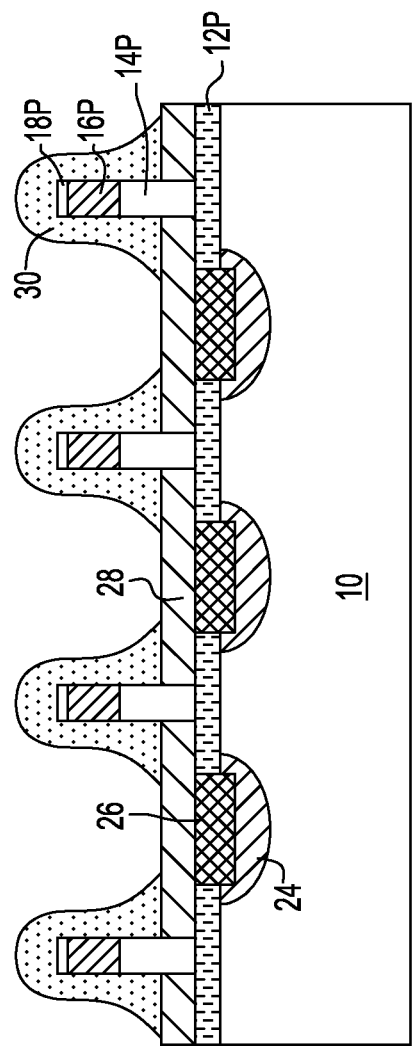
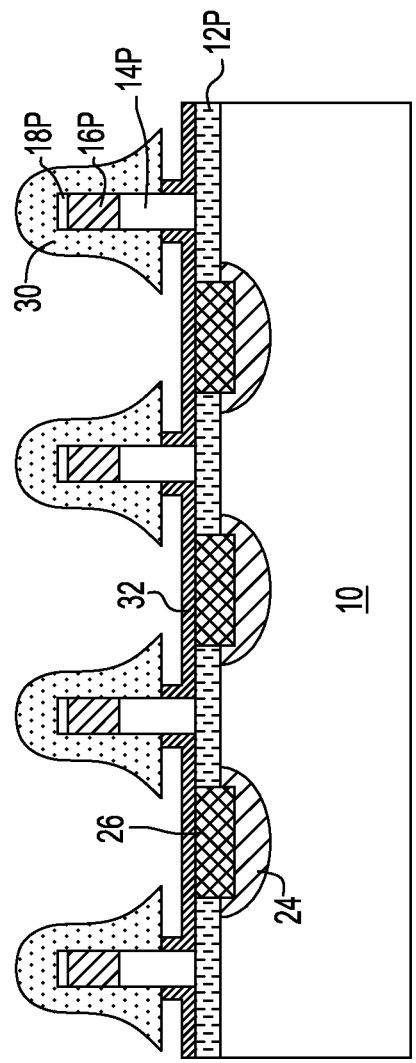

FINFET VERTICAL FLASH MEMORY

BACKGROUND

The present application relates to a semiconductor structure and a method of forming the same. More particularly, the present application relates to a semiconductor structure including a fin field effect transistor device having a flash (i.e., nonvolatile) memory of high-density and a method of forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors can achieve higher drive currents with increasingly smaller dimensions as compared to conventional planar FETs. Employment of finFETs in semiconductor devices requires different semiconductor processing steps than planar FETs, and therefore, a flash memory (i.e., nonvolatile) device having a manufacturing sequence that is compatible with a manufacturing sequence of finFETs is needed. Flash memory is commonly used in mobile devices, personal computers, servers, digital audio players, digital cameras, synthesizers and video games.

SUMMARY

A plurality of fin structures containing, from bottom to top, a non-doped semiconductor portion and a second doped semiconductor portion of a first conductivity type, extend upwards from a surface of a first doped semiconductor portion of the first conductivity type. A trapping material (e.g., an electron-trapping material) is present along a bottom portion of sidewall surfaces of each non-doped semiconductor portion and on exposed portions of each first doped semiconductor portion. Functional gate structures straddle each fin structure. Metal lines are located above each fin structure and straddle each functional gate structure. Each metal line is orientated perpendicular to each functional gate structure and has a bottommost surface that is in direct physical contact with a portion of a topmost surface of each of the second doped semiconductor portions.

In one aspect of the present application, a semiconductor structure is provided. The semiconductor structure of the present application includes a plurality of first doped semiconductor portions of a first conductivity type located on a topmost surface of a bulk semiconductor substrate. A plurality of fin structures extend upwards from a surface of each first doped semiconductor portion. Each fin structure of the plurality of fin structures includes from bottom to top, a non-doped semiconductor portion and a second doped semiconductor portion of the first conductivity type. A trapping material layer is present along a bottom portion of sidewall surfaces of each non-doped semiconductor portion of each fin structure and on exposed portions of each first doped semiconductor portion. A plurality of functional gate structures straddles each fin structure of the plurality of fin structures. A plurality of metal lines is located above each fin structure of the plurality of fin structures and straddles each functional gate structure of the plurality of functional gate structures. In accordance with the present application, each metal line is orientated perpendicular to each functional gate structure and has a bottommost surface that is in direct physical contact with a topmost surface of each of the second doped semiconductor portions.

In another aspect of the present application, a method of forming a semiconductor structure is provided. In one embodiment of the present application, the method includes forming a plurality of fin structures on a surface of a first doped semiconductor layer of a first conductivity type, wherein each fin structure of the plurality of fin structures includes from bottom to top, a non-doped semiconductor portion and a second doped semiconductor portion of the first conductivity type. A first sacrificial spacer is formed surrounding each fin structure and thereafter the first doped semiconductor layer not protected by the fin structure and the first sacrificial spacer is patterned to provide a plurality of first doped semiconductor portions beneath each fin structure. Next, the first sacrificial gate spacer is removed from each fin structure, and a dielectric material layer is formed between each fin structure and on a topmost surface of each first doped semiconductor portion. A second sacrificial spacer is then formed surrounding each fin structure and located on a topmost surface of the dielectric material layer, and thereafter the dielectric material layer is removed to expose a bottom sidewall surface of each non-doped semiconductor portion of each fin structure. Next, a trapping material is formed on the exposed bottom sidewall surface of each non-doped semiconductor fin portion, and thereafter the second sacrificial spacer is removed. A plurality of function gate structures which straddle each fin structure of the plurality of fin structures is then formed.

The method of the present application may further include forming a plurality of metal lines located above each fin structure of the plurality of fin structures and straddling each functional gate structure of the plurality of functional gate structures, wherein each metal line is orientated perpendicular to each functional gate structure and has a bottommost surface that is in direct physical contact with a portion of a topmost surface of each of the second doped semiconductor portions.

BRIEF DESCRIPTION OF SEVERAL VIEWS OF THE DRAWINGS

FIG. 1 is a cross sectional view of an exemplary semiconductor structure including, from bottom to top, a bulk semiconductor structure, a first doped semiconductor layer containing a first semiconductor material of a first conductivity type, a non-doped semiconductor layer containing a second semiconductor material, and a second doped semiconductor layer containing a third semiconductor material of the first conductivity type that can be employed in accordance with an embodiment of the present application.

FIG. 2 is a cross sectional view of the exemplary semiconductor structure of FIG. 1 after forming a hard mask layer on a topmost surface of the second doped semiconductor layer.

FIG. 3 is a cross sectional view of the exemplary semiconductor structure of FIG. 2 after patterning the hard mask layer, the second doped semiconductor layer, and the non-doped semiconductor layer to provide a plurality of fin structures comprising, from bottom to top, a remaining portion of the non-doped semiconductor layer, a remaining portion of the second doped semiconductor and a remaining portion of the hard mask layer located on a topmost surface of the first doped semiconductor layer.

FIG. 4 is a cross sectional view of the exemplary semiconductor structure of FIG. 3 after forming a first sacrificial spacer surrounding each fin structure of the plurality of fin structures.

FIG. 5 is a cross sectional view of the exemplary semiconductor structure of FIG. 4 after removing portions of first doped semiconductor layer that are not protected by each fin structure of the plurality of fin structures and the first sacrificial spacer.

FIG. 6 is a cross sectional view of the exemplary semiconductor structure of FIG. 5 after forming a doped region of a second conductivity type which is opposite to the first conductivity type into an exposed portion of the bulk semiconductor substrate.

FIG. 9 is a cross sectional view of the exemplary semiconductor structure of FIG. 8 after forming a second sacrificial spacer surrounding each fin structure of the plurality of fin structures.

FIG. 10 is a cross sectional view of the exemplary semiconductor structure of FIG. 9 after removing the dielectric material layer located between each fin structure of the plurality of fin structures and forming a trapping material layer.

DESCRIPTION

Figure 7:
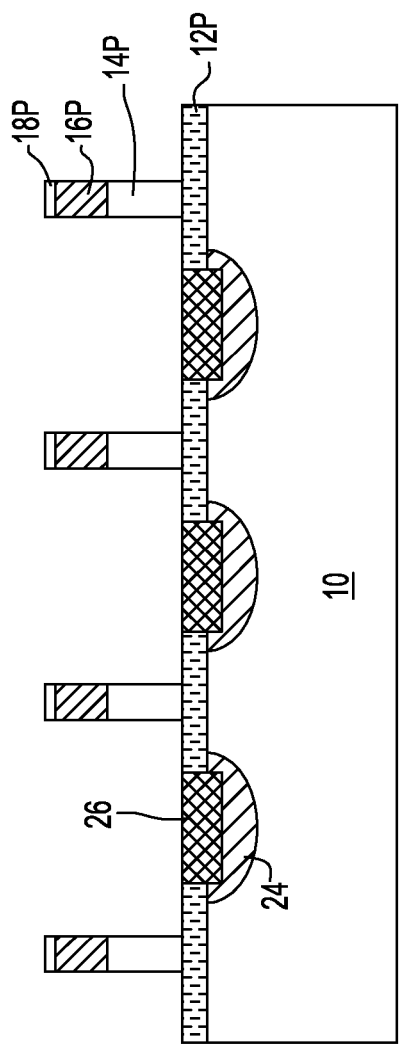
FIG. 7 is a cross sectional view of the exemplary semiconductor structure of FIG. 6 after formation of a trench isolation structure and removal of the first sacrificial spacer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, there is illustrated an exemplary semiconductor structure including, from bottom to top, a bulk semiconductor structure 10, a first doped semiconductor layer 12L containing a first semiconductor material of a first conductivity type, a non-doped semiconductor layer 14L containing a second semiconductor material, and a second doped semiconductor layer 16L containing a third semiconductor material of the first conductivity type that can be employed in accordance with an embodiment of the present application.

The term "bulk" as used in conjunction with the phrase "semiconductor substrate" denotes that the semiconductor substrate 10 is comprised entirely of a semiconductor material. The semiconductor material of the bulk semiconductor substrate 10, which may be referred to as a base semiconductor material, may include but is not limited to, Si, Ge, SiGe, SiC, SiGeC, and III/V compound semiconductors such as, for example, InAs, GaAs, and InP. In some embodiments of the present application, the entire bulk semiconductor substrate 10 is comprised of a single semiconductor material. In another embodiment, the bulk semiconductor substrate 10 can be comprised of two or more of the aforementioned semiconductor materials.

The bulk semiconductor substrate 10 may be a single crystalline semiconductor material, a polycrystalline semiconductor material or an amorphous semiconductor material. In one embodiment of the present application, the bulk semiconductor substrate 10 is comprised of single crystalline silicon.

A first doped semiconductor layer 12L containing a first semiconductor material of a first conductivity type is then formed so as to entirely cover a topmost surface of the bulk semiconductor substrate 10. The first semiconductor material that provides the first doped semiconductor material layer 12L may include one of the semiconductor materials mentioned above for the bulk semiconductor substrate 10. In one embodiment of the present application, the first semiconductor material that provides the first doped semiconductor layer 12L may comprise a same semiconductor material as that of the bulk semiconductor substrate 10. In one example, the first semiconductor material that provides the first doped semiconductor layer 12L and the bulk semiconductor substrate 10 may be comprised of silicon. In another embodiment of the present application, the first semiconductor material that provides the first doped semiconductor layer 12L may comprise a different semiconductor material as that of the bulk semiconductor substrate 10. In one example, the first semiconductor material that provides the first doped semiconductor layer 12L may be comprised of a silicon germanium alloy, while the bulk semiconductor substrate 10 may be comprised of silicon.

The first doped semiconductor layer 12L can be formed utilizing an epitaxial growth, i.e., deposition process. The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. Thus, in this instance, the first doped semiconductor layer 12L has an epitaxial relationship, i.e., same crystal orientation, with the topmost surface of the bulk semiconductor substrate 10.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The first doped semiconductor layer 12L can be formed utilizing a precursor gas that includes a semiconductor source and a carrier gas. When silicon is present in the first doped semiconductor layer 12L, the semiconductor source is a silicon source. Examples of silicon sources that can be employed include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. When germanium is present in the first doped semiconductor layer 12L, the semiconductor source is a germanium source. Examples of germanium sources include germane, digermane, halogermane, dichlorogermane, trichlorogermane, tetrachlorogermane and combinations thereof. When a silicon germanium alloy is present in the first doped semiconductor layer 12L, a precursor gas mixture comprises a silicon source and a germanium source may be used. Other semiconductor sources as are well known to those skilled in the art can also be used in providing the first doped semiconductor layer 12L. Carrier gases like hydrogen, nitrogen, helium and argon can be used.

As mentioned above, the first doped semiconductor layer 12L contains a first semiconductor material of a first conductivity type. In one embodiment of the present application, the first conductivity type is n-type. "N-type" refers to the addition of impurities that contributes free electrons to an intrinsic semiconductor. Examples of n-type dopants that can be present in the first doped semiconductor layer 12L include at least one element from Group VA of the Periodic Table of Elements. In particular, antimony, arsenic and phosphorus can be used as the at least one n-type dopant that can be present in the first doped semiconductor layer 12L.

In another embodiment of the present application, the first conductivity type is p-type. P-type" refers to the addition of impurities to an intrinsic semiconductor that creates deficiencies of valence electrons. Examples of p-type dopants, i.e., impurities, include at least one element from Group IIIA of the Periodic Table of Elements. For example, one of boron, aluminum, gallium and indium may be used as the p-type dopant that can be present in the first doped semiconductor layer 12L.

In one embodiment of the present application, the at least one n-type dopant or the at least one p-type dopant can be introduced during the epitaxial deposition that provides the first doped semiconductor layer 12L utilizing an in-situ doping epitaxial growth process. In such a process, an n-type dopant source gas or a p-type dopant source gas is present in the precursor gas that provides a first doped semiconductor layer 12L.

In another embodiment of the present application, the at least one n-type dopant or the at least one p-type dopant can be introduced after the epitaxial deposition of an intrinsic semiconductor material. In such an instance, at least one n-type dopant or at least one p-type dopant can be introduced in a previously epitaxial grown semiconductor layer utilizing one of ion implantation and gas phase doping.

A non-doped semiconductor layer 14L containing a second semiconductor material is then formed so as to entirely cover a topmost surface of the first doped semiconductor layer 12L. The second semiconductor material that provides the non-doped semiconductor layer 14L may include one of the semiconductor materials mentioned above for the first semiconductor material that provides the first doped semiconductor layer 12L. In one embodiment of the present application, the second semiconductor material that provides the non-doped semiconductor layer 14L may comprise a same semiconductor material as that of the first semiconductor material that provides the first doped semiconductor layer 12L. In one example, the first semiconductor material that provides the first doped semiconductor layer 12L and the second semiconductor material that provides the non-doped semiconductor layer 14L may be comprised of silicon. In another embodiment of the present application, the second semiconductor material that provides the non-doped semiconductor layer 14L may comprise a different semiconductor material as that of the first semiconductor material that provides the first doped semiconductor layer 12L. In one example, the first semiconductor material that provides the first doped semiconductor layer 12L may be comprised of a silicon germanium alloy, while the second semiconductor material that provides the non-doped semiconductor layer 14L may be comprised of silicon.

The non-doped semiconductor layer 14L can be formed utilizing an epitaxial growth, i.e., deposition process, such as those as mentioned above in forming the first doped semiconductor layer 12L. The conditions of the epitaxial deposition and precursor gases mentioned above in forming the first doped semiconductor layer 12L can also be used here for forming the non-doped semiconductor layer 14L. Since an epitaxial growth process is used in forming the non-doped semiconductor layer 14L, the non-doped semiconductor layer 14L has an epitaxial relationship with the topmost surface of the first doped semiconductor layer 12L.

In some embodiments of the present application, the first doped semiconductor layer 12L and the non-doped semiconductor layer 14L can be formed without breaking vacuum between the two epitaxial growth processes. In other embodiments of the present application, the vacuum may be broken between the two epitaxial growth processes that are used to provide the first doped semiconductor layer 12L and the non-doped semiconductor layer 14L. The non-doped semiconductor layer 14L that is formed generally has a thickness that is greater than the thickness of the first doped semiconductor layer 12L.

A second doped semiconductor layer 16L containing a third semiconductor material of the first conductivity type is then formed so as to entirely cover a topmost surface of the non-doped semiconductor layer 14L. The third semiconductor material that provides the second doped semiconductor layer 16L may include one of the semiconductor materials mentioned above for the second semiconductor material that provides the non-doped semiconductor layer 14L. In one embodiment of the present application, the third semiconductor material that provides the second doped semiconductor layer 16L may comprise a same semiconductor material as that of the second semiconductor material that provides the non-doped semiconductor layer 14L. In one example, the second semiconductor material that provides the non-doped semiconductor layer 14L and the third semiconductor material that provides the second doped semiconductor layer 16L may be comprised of silicon. In another embodiment of the present application, the third semiconductor material that provides the second doped semiconductor layer 16L may comprise a different semiconductor material as that of the second semiconductor material that provides the non-doped semiconductor layer 14L. In one example, the second semiconductor material that provides the non-doped semiconductor layer 14L may be comprised of a silicon germanium alloy, while the third semiconductor material that provides the second doped semiconductor layer 16L may be comprised of silicon.

The second doped semiconductor layer 16L can be formed utilizing an epitaxial growth, i.e., deposition process, such as those as mentioned above in forming the first doped semiconductor layer 12L. The conditions of the epitaxial deposition, precursor gases and dopants mentioned above in forming the first doped semiconductor layer 12L can also be used here for forming the second doped semiconductor layer 16L. Since an epitaxial growth process is used in forming the second doped semiconductor layer 16L, the second doped semiconductor layer 16L has an epitaxial relationship with the topmost surface of the non-doped semiconductor layer 14L.

In some embodiments of the present application, the non-doped semiconductor layer 14L and the second semiconductor layer 16L can be formed without breaking vacuum between the two epitaxial growth processes. In other embodiments of the present application, the vacuum may be broken between the two epitaxial growth processes that are used to provide the non-doped semiconductor layer 14L and the second doped semiconductor layer 16L.

In accordance with an embodiment of the present application, the second doped semiconductor layer 16L can contain an n-type dopant or a p-type dopant. The range of dopant present in the second doped semiconductor layer 16L can be equal to, greater than or less than the dopant that is present in the first doped semiconductor layer 12L.

The second doped semiconductor layer 16L typically has a thickness than is less than the thickness of the non-doped semiconductor layer 14L. The second doped semiconductor layer 16L may however have a thickness that is equal to, lesser than or greater than the thickness of the first doped semiconductor layer 12L.

Semiconductor material layers 12L, 14L and 16L provide an epitaxial semiconductor material stack atop the bulk semiconductor substrate 10. In one embodiment, the first conductivity type is p-type, and the epitaxial semiconductor material stack comprises, from bottom to top, a p-i-p semiconductor material stack; "i" stands for an intrinsic, i.e., non-doped, semiconductor material. In another embodiment, the first conductivity type is n-type, and the epitaxial semiconductor material stack comprises, from bottom to top, an n-i-n semiconductor material stack.

Referring now to FIG. 2, there is illustrated the exemplary semiconductor structure of FIG. 1 after forming a hard mask layer 18L on a topmost surface of the second doped semiconductor layer 16L. The hard mask layer 18L that is present on a topmost surface of the second doped semiconductor layer 18L is a contiguous layer that covers the entirety of the topmost surface of the second doped semiconductor layer 16L. The hard mask layer 18L that is employed in the present application may include a semiconductor oxide, a semiconductor nitride and/or a semiconductor oxynitride. In one embodiment, the hard mask material that can be used in providing the hard mask layer 18L can be comprised of silicon dioxide. In another embodiment, the hard mask material that can be used in providing the hard mask layer 18L can be comprised of silicon nitride. In yet another embodiment, the hard mask material that can be used in providing the hard mask layer 18L can be a stack comprised of, in any order, silicon dioxide and silicon nitride.

In some embodiments of the present application, the hard mask material that can be used in providing the hard mask layer 18L can be formed by a deposition process such as, for example, chemical vapor deposition (CVD) or plasma enhanced chemical vapor deposition (PECVD). In other embodiments, the hard mask material that can be used in providing the hard mask layer 18L can be formed by a thermal process such as, for example, thermal oxidation and/or thermal nitridation. In yet other embodiments, the hard mask material that can be used in providing the hard mask layer 18L can be formed by a combination of a deposition process and a thermal process. The thickness of the hard mask material that can be used in providing the hard mask layer 18L can range from 2 nm to 10 nm, with a thickness from 3 nm to 6 nm being more typical.

Referring now to FIG. 3, there is illustrated the exemplary semiconductor structure of FIG. 2 after patterning the hard mask layer 18L, the second doped semiconductor layer 16L, and the non-doped semiconductor layer 14L to provide a plurality of fin structures 20 comprising, from bottom to top, a remaining portion of the non-doped semiconductor layer 14L, a remaining portion of the second doped semiconductor 16L and a remaining portion of the hard mask layer located 18L on a topmost surface of the first doped semiconductor layer 12L.

The plurality of fin structures 20 can be defined by a patterning process. In one embodiment, the patterning process used to define the plurality of fin structures 20 includes a sidewall image transfer (SIT) process. The SIT process includes forming a contiguous mandrel material layer (not shown) on the topmost surface of structure shown in FIG. 2. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown).

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each silicon fin.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the semiconductor materials that provide the plurality of fin structures 20. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process. In some embodiments, lithography and etching can be used to define the plurality fin structures 20.

As used herein, a "fin" refers to a contiguous structure including a remaining portion of the non-doped semiconductor layer 14L, a remaining portion of the second doped semiconductor 16L and a remaining portion of the hard mask layer located 18L. The remaining portion of the non-doped semiconductor layer 14L can now be referred to as non-doped semiconductor portion 14P. The remaining portion of the second doped semiconductor layer 16L can be referred to herein as a second doped semiconductor portion 16P. The remaining portion of the hard mask layer located 18L can be referred to herein as a hard mask portion 18P. The first doped semiconductor layer 12L is not patterned during the formation of the plurality of fin structures 20. Each fin structure 20 includes a pair of vertical sidewalls that are parallel to each other. As used herein, a surface is "vertical" if there exists a vertical plane from which the surface does not deviate by more than three times the root mean square roughness of the surface. As is shown, sidewalls of the non-doped semiconductor portion 14P, the second doped semiconductor material portion 16P, and the hard mask portion 18P are vertically coincident with each other.

In one embodiment of the present application, each fin structure of the plurality of fin structures 20 has a width from 4 nm to 30 nm. In another embodiment of the present application, each fin structure of the plurality of fin structures 20 has a width from 5 nm to 12 nm. Also, each fin structure of the plurality of fin structures 20 is oriented parallel to each other.

Referring now to FIG. 4, there is illustrated the exemplary semiconductor structure of FIG. 3 after forming a first sacrificial spacer 22 surrounding each fin structure of the plurality of fin structures 20. By "surrounding" it is meant that the first sacrificial spacer 22 is formed adjacent to and atop each fin structure of the plurality of fin structures 20. Thus, the first sacrificial spacer 22 is located on sidewall surfaces of each fin structure of the plurality of fin structures 20 as well as on a topmost surface, i.e., the hard mask portion 18P, of each fin structure of the plurality of fin structures 20. The first sacrificial spacer 22 has a base that is located on a topmost surface portion of the first doped semiconductor layer 12L.

The first sacrificial spacer 22 comprises any dielectric spacer material that differs from the hard mask material that provides hard mask layer 18L. Examples of dielectric spacer materials that can be used in providing the first sacrificial spacer 22 include, for example, a dielectric oxide, dielectric nitride, and/or dielectric oxynitride. In one example, the dielectric spacer material used in providing the first sacrificial spacer 22 may be composed of silicon dioxide or silicon nitride. The dielectric spacer material that provides the first sacrificial spacer 22 can be provided by a deposition process including, for example, chemical vapor deposition (CVD), plasma enhanced chemical vapor deposition (PECVD), or physical vapor deposition (PVD). Following the deposition of the dielectric spacer material, an etch such as, for example, a reactive ion etch, can be used to provide the first sacrificial spacer 22.

Referring now to FIG. 5, there is illustrated the exemplary semiconductor structure of FIG. 4 after removing portions of first doped semiconductor layer 12L that are not protected by each fin structure of the plurality of fin structures 20 and the first sacrificial spacer 22. The remaining first doped semiconductor layer 12L can be referred herein as a first doped semiconductor portion 12P. As is shown, a first doped semiconductor material portion 12P is present beneath each fin structure of the plurality of fin structures 20 and beneath each first sacrificial spacer 22. Each first doped semiconductor portion 12P is formed by utilizing an anisotropic etching process that is selective in removing the exposed portions of the first doped semiconductor layer 12L relative to dielectric spacer material that provides the first sacrificial spacer 22. The anisotropic etching process that is employed stops at a topmost surface of the bulk semiconductor substrate 10.

Referring now to FIG. 6, there is illustrated the exemplary semiconductor structure of FIG. 5 after forming a doped region 24 of a second conductivity type which is opposite to the first conductivity type into an exposed portion of the bulk semiconductor substrate 10. Each doped region 24 is formed by ion implantation of a p-type dopant or an n-type dopant into an exposed portion of the bulk semiconductor substrate 10 that was formed by removing a portion of the first doped semiconductor layer 12L that is not protected by a fin structure 20 and the first sacrificial spacer 22. Following the implantation of a p-type dopant or an n-type dopant into an exposed portion of the bulk semiconductor substrate 10, an anneal be used to activate the dopant. The conditions for the ion implantation and anneal that can be used in providing the doped region 24 of the second conductivity type are similar to those used in forming source regions and drain regions of a planar semiconductor device in a bulk semiconductor substrate.

In accordance with an embodiment of the present application, the doped region 24 can contain an n-type dopant or a p-type dopant. The doped region 24 has a bottommost surface that is located below the topmost surface of the bulk semiconductor substrate 10.

Referring now to FIG. 7, there is illustrated the exemplary semiconductor structure of FIG. 6 after formation of a trench isolation structure 26 and removal of the first sacrificial spacer 22. The trench isolation structure 26 can be formed utilizing a conventional trench isolation process well known to those skilled in the art. For example, lithography, etching and filling of a trench with a trench dielectric such as an oxide may be used in forming the trench isolation structure 26. The trench that provides the trench isolation structure 26 is formed at least partially within the doped region 24 of the bulk silicon substrate 10. Optionally, a liner may be formed in the trench prior to trench fill, a densification step may be performed after the trench fill and an etch back process may follow the trench fill as well.

In some embodiments, and as shown, the topmost surface of the trench isolation structure 26 is coplanar with a topmost surface of each first doped semiconductor portion 12P. In other embodiments (not shown), the topmost surface of the trench isolation structure 26 is located beneath a topmost surface of each first doped semiconductor portion 12P, but above a topmost surface of the bulk semiconductor substrate 10. As is shown, upper sidewall surfaces of the trench isolation structure 26 contact sidewall surfaces of neighboring first doped semiconductor portion 12P. As is also shown, a bottommost surface of the trench isolation structure 26 contacts a portion of the doped region 24.

After forming the trench isolation structure 26, the first sacrificial spacer 22 can be removed by utilizing an etching process that selectively removes the dielectric spacer material that provides the first sacrificial spacer 22.

The removal of the first sacrificial spacer 22 exposes each fin structure of the plurality of fin structures 20. That is, sidewall surfaces of the non-doped semiconductor portion 14P, sidewall surfaces of the second doped semiconductor portion 16P, and sidewall surfaces of the hard mask portion 18P are exposed. Also, the topmost surface of the hard mask portion 18P of each fin structure of the plurality of the fin structures 20 is exposed. In addition to exposing each fin structure of the plurality of fin structures 20, the removal of the first sacrificial spacer 22 also exposes a topmost surface of each first doped semiconductor portion 12P.

Figure 8:
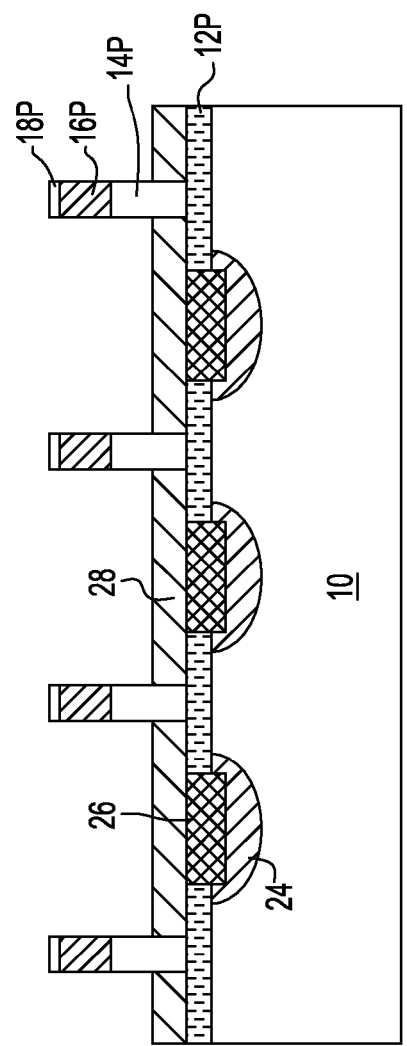
FIG. 8 is a cross sectional view of the exemplary semiconductor structure of FIG. 7 after forming a dielectric material layer between each fin structure of the plurality of fin structures.

Referring now to FIG. 8, there is illustrated the exemplary semiconductor structure of FIG. 7 after forming a dielectric material layer 28 between each fin structure of the plurality of fin structures 20. As is shown, a bottommost surface of the dielectric material layer 28 is in direct physical contact with an exposed topmost surface of each first doped semiconductor portion 12P. As is also shown, sidewall surfaces of the dielectric material layer 28 are in direct contact with a sidewall surface of the non-doped semiconductor portion 14P. As is further shown, a topmost surface of the dielectric material layer 28 is located beneath a topmost surface of the non-doped semiconductor portion 14P of each fin structure 20.

The dielectric material layer 28 may be comprised of any dielectric material. In one embodiment, the dielectric material layer 28 is comprised of an oxide, nitride or oxynitride. In one example, the dielectric material layer 28 is comprised of silicon dioxide. Other dielectric materials that can be used in providing the dielectric material layer 28 include, but are not limited to, silicon nitride, silicon oxynitride, porous or non-porous organosilicate glass, porous or non-porous nitrogen-doped organosilicate glass, or a combination thereof.

In one embodiment of the present application, the dielectric material layer 28 can be formed utilizing an anisotropic deposition process such as, for example, plasma deposition. In another embodiment of the present application, the dielectric material layer 28 can be formed utilizing a sequence of deposition and etch back processes. In such an embodiment, the dielectric material 28 can be deposited by one of chemical vapor deposition, plasma enhanced chemical vapor deposition, physical vapor deposition or spin-on coating. The etch back may include a dry etching process such as reactive ion etching or a chemical wet etch may be used.

The thickness of the dielectric material layer 28 may vary so long as the thickness of the dielectric material layer 28 does not extend above the topmost surface of the non-doped semiconductor portion 14P of each fin structure of the plurality of fin structures 20.

Referring now to FIG. 9, there is illustrated the exemplary semiconductor structure of FIG. 8 after forming a second sacrificial spacer 30 surrounding each fin structure of the plurality of fin structures 20. Thus, the second sacrificial spacer 30 is located on the exposed sidewalls of the non-doped semiconductor portion 14P, the exposed sidewalls of the second doped semiconductor portion 16P and the exposed sidewalls of the hard mask portion 18P of each fin structure of the plurality of fin structures 20. Also, each second sacrificial spacer 30 is located on an exposed topmost surface of the hard mask portion of each fin structure of the plurality of fin structure 20. The second sacrificial spacer 30 also has a base that is present on a portion of the dielectric material layer 28 that is formed between each fin structure of the plurality of fin structures 20.

The second sacrificial spacer 30 may include one of dielectric spacer materials used in providing the first sacrificial spacer 22, yet the dielectric spacer material should be different from the dielectric material used in providing the dielectric material layer 28. Also, the process mentioned above in forming the first sacrificial spacer 22 is also applicable here in providing the second sacrificial spacer 30.

Referring now to FIG. 10, there is illustrated the exemplary semiconductor structure of FIG. 9 after removing the dielectric material layer 28 located between each fin structure of the plurality of fin structures 20 and forming a trapping material layer 32.

The removal of the dielectric material layer 28 can be performed utilizing an etching process that selectively removes the dielectric material that provides the dielectric material layer 28 relative to the dielectric spacer material that provides the second sacrificial spacer 30. Upon removal of the dielectric material layer 28 from the structure, a lower portion of the sidewall surfaces of the non-doped semiconductor portion 14P are exposed. Also exposed upon removal of the dielectric material layer 28 is a portion of the topmost surface of the first doped semiconductor portion 12P.

After removing the dielectric material layer 28, trapping material layer 32 is formed on the exposed lower portion of the sidewall surfaces of the non-doped semiconductor portion 14P and the exposed portion of the topmost surface of the first doped semiconductor portion 12P.

In one embodiment of the present application, trapping material layer 32 is an electron-trapping material. "By "electron-trapping material" it is meant a material that includes bulk oxygen vacancies or an interface region susceptible to electron trapping. Examples of electron-trapping materials that can be employed as trapping material layer 32 include, but are not limited to, doped metal oxides, such as, for example, La/LaO, and doped metal nitrides such as, for example, La/LaN. In addition to the aforementioned electron-trapping materials, the trapping material layer 32 may include other material combinations conductive to electron or hole trapping within the grain boundaries of the material or in proximity to the material phase transitions, crystal discontinuities, defects and dislocations, and formation of interface states.

Notwithstanding the type of material employed as trapping material layer 32, trapping material layer 32 can be formed by a deposition process such as, for example, chemical vapor deposition (CVD), plasma enhanced chemical vapor deposition (PECVD), physical vapor deposition (PVD), sputtering, or atomic layer deposition. The thickness of the trapping material layer 32 can be from 1 nm to 20 nm. Other thicknesses that are lesser than or greater than the aforementioned thickness range can also be employed for trapping material layer 32.

Figure 11:
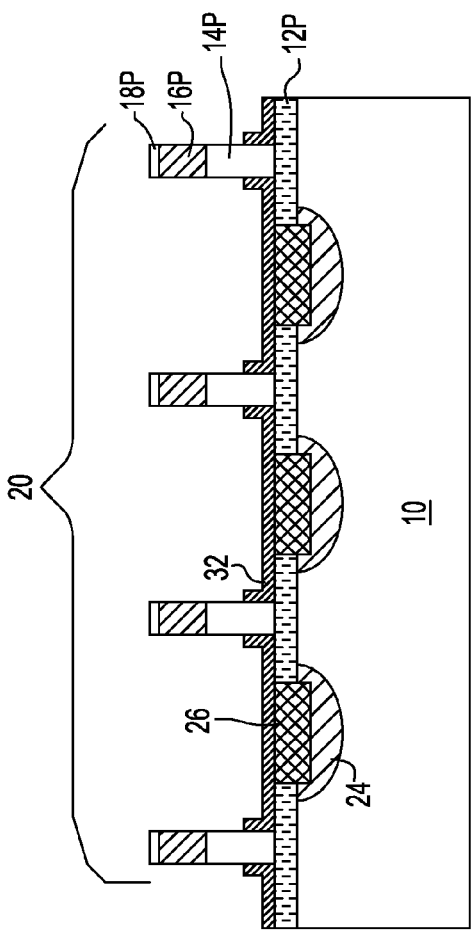
FIG. 11 is a cross sectional view of the exemplary semiconductor structure of FIG. 10 after removing the second sacrificial spacer.

Referring now to FIG. 11, there is illustrated the exemplary semiconductor structure of FIG. 10 after removing the second sacrificial spacer 30. The second sacrificial spacer 30 can be removed by utilizing an etching process that selectively removes the dielectric spacer material that provides the second sacrificial spacer 30.

The removal of the second sacrificial spacer 30 exposes each fin structure of the plurality of fin structures 20. That is, sidewall surfaces of the non-doped semiconductor portion 14P, sidewall surfaces of the second doped semiconductor portion 16P, and sidewall surfaces of the hard mask portion 18P are exposed. Also, the topmost surface of the hard mask portion 18P of each fin structure of the plurality of the fin structures 20 is exposed. In addition to exposing each fin structure of the plurality of fin structures 20, the removal of the second sacrificial spacer 30 also exposes a topmost surface of each trapping material layer 32.

Figure 12:
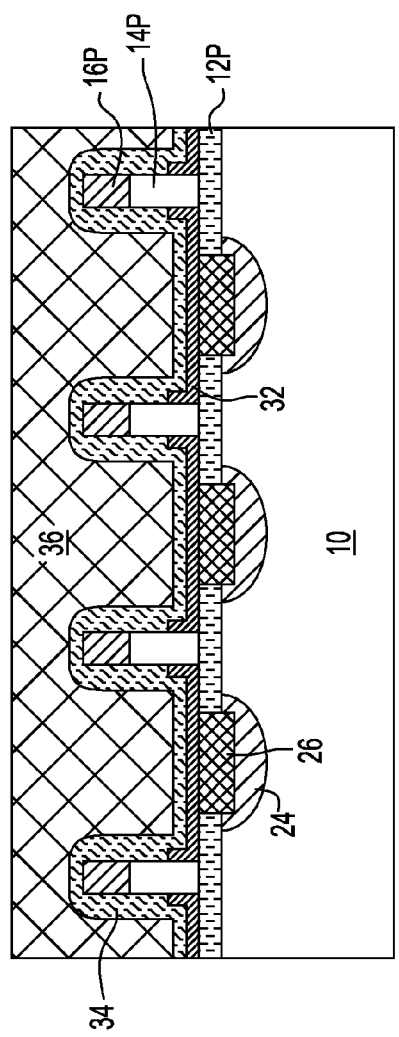
FIG. 12 is a cross sectional view of the exemplary semiconductor structure of FIG. 11 after forming a functional gate structure.

Referring now to FIG. 12, there is illustrated the exemplary semiconductor structure of FIG. 11 after forming a functional gate structure (34, 36). Although a single functional gate structure is described and illustrated, a plurality of functional gate structures is formed. Each functional gate structure (34, 36) straddles each of the fin structures of the plurality of fin structures 20. By "straddles" it is meant that the functional gate structure is located directly above a topmost surface of the semiconductor fin as well as adjacent two vertical sidewalls of the semiconductor fin. The term "functional gate structure" is used throughout the present application as a permanent gate structure used to control output current (i.e., flow of carriers in the channel) of a semiconducting device through electrical or magnetic fields. The functional gate structure (34, 36) can be formed utilizing a gate first process or a gate last process.

In a gate first process, at least one functional gate structure is formed prior to forming the source and drain regions. The at least one functional gate structure can be formed by deposition of a gate material stack and then patterning the gate material stack by lithography and etching. In some embodiments of the present application, the hard mask portion 18P can be removed from atop each fin structure 20 prior to forming the functional gate structure. In another embodiment, the hard mask portion 18P can remain in the structure. In a further embodiment, the hard mask portion 18P can be removed from atop some of the fin structures 20, while remaining on other fin structures 20. When the hard mask portion 18P is removed, a chemical mechanical planarization process can be used.

The at least one functional gate structure includes a gate dielectric material portion 34 and a gate conductor portion 36. While the embodiment that is illustrated discloses that the gate dielectric material portion 34 and the gate conductor portion 36 are the same, it is also possible to form a gate dielectric material portion and/or a gate electrode portion in one area of the structure that is different from the gate dielectric material portion and/or the gate electrode portion in another area of the structure. In such embodiments, conventional block mask technology can be used in forming the different gate dielectric material portion and/or different gate electrode portion in different areas of the structure; the different areas can represent device regions.

In the embodiment illustrated in the drawings, the gate dielectric material portion 34 is present on three surfaces (i.e., the two vertical sidewalls and the topmost surface) of each fin structure 20. In other embodiments, and when the hard mask portion 18P is present, the gate dielectric portion is located only on the two vertical sidewalls of the each fin structure 20.

The gate dielectric material portion 34 includes any gate dielectric material. In one embodiment, the gate dielectric material that provides the gate dielectric material portion 34 can be a semiconductor oxide, a semiconductor nitride, and/or a semiconductor oxynitride. In one example, the gate dielectric material that provides each gate dielectric material portion 34 can be composed of silicon dioxide, silicon nitride and/or silicon oxynitride. In another embodiment of the present application, the gate dielectric material that provides the gate dielectric material portion 34 may include at least a dielectric metal oxide. Exemplary dielectric metal oxides that can be used as the gate dielectric material that provides the gate dielectric material portion 34 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides the gate dielectric material portion 34.

In some embodiments of the present application, the gate dielectric material that provides the gate dielectric material portion 34 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides the gate dielectric material portion 34 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material that provides the gate dielectric material portion 34 can have a thickness in a range from 1 nm to 10 nm. Other thicknesses that are lesser than or greater than the aforementioned thickness range can also be employed for the gate dielectric material that provides the gate dielectric material portion 34.

The gate conductor portion 36 may comprise any conductive material. Examples of conductive materials that can provide each gate conductor portion 36 include, but are not limited to, doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the conductive material that provides the gate conductor portion 36 is comprised of a doped polysilicon or doped polysilicon germanium. In another embodiment, a lower portion of the conductive material that provides the gate conductor portion 36 is comprised a conductive material other than doped polysilicon or doped polysilicon germanium, and an upper portion of the conductive material that provides the gate conductor portion 36 is comprised of doped polysilicon or doped silicon germanium.

The conductive material that provides the gate conductor portion 36 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the conductive material that provides the gate conductor portion 36 has a thickness from 1 nm to 100 nm. Other thicknesses that are lesser than or greater than the aforementioned thickness range can also be employed for the conductive material that provides the gate conductor portion 36.

As mentioned above, the functional gate structure can be formed by first providing a material stack of, from bottom to top, a gate dielectric material and a conductive material. In some embodiments, block mask technology may be used to form different gate dielectric materials and/or conductive materials within various device regions. Following the formation of the material stack, the material stack can be patterned by lithography and etching. Lithography can include forming a photoresist (not shown) on the topmost surface of the conductive material of the material stack, exposing the photoresist to a desired pattern of radiation, and then developing the exposed photoresist with a resist developer to provide a patterned photoresist atop the material stack. At least one etch is then employed which transfers the pattern from the patterned photoresist into the various materials of the material stack. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing. After patterning the gate material stack, a functional gate structure including gate dielectric material portion 34 and a gate conductor portion 36 is formed.

At this point of the present application, conventional processing can be used to form a dielectric spacer on the exposed sidewalls of the functional gate structure, and thereafter dopants can be introduced into portions of each fin structure 20 not including the functional gate structure and dielectric spacer utilizing techniques that are well known to those skilled in the art to form the source regions and the drain regions of each finFET device. The source regions in each various device region may then be merged utilizing an epitaxial growth process.

In some embodiments, a gate last process (not specifically shown) can be used in forming the at least one functional gate structure. In such an embodiment, a sacrificial gate structure (not shown) is first formed straddling each semiconductor fin within the various device regions. The term "sacrificial gate structure" is used throughout the present application to denote a material that serves as a placeholder structure for a functional gate structure to be subsequently formed.

The sacrificial gate structure can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structures.

Next, a dielectric spacer can be optionally formed on sidewalls of each sacrificial gate structure. The source and drain regions (and the corresponding extension regions) can be formed after formation of the either the sacrificial gate structure or spacer formation. Next, a dielectric material is provided that has an upper surface that is planar to each sacrificial gate structure. Then, each sacrificial gate structure can be replaced with a functional gate structure as defined above.

Figure 13:
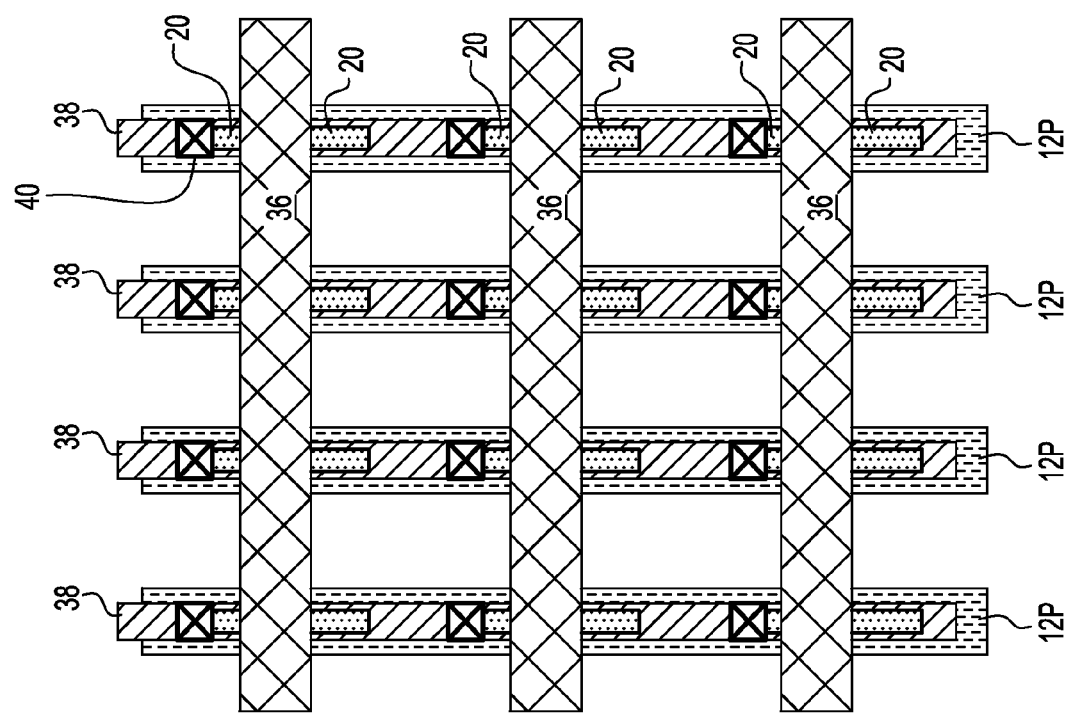
FIG. 13 is a top down view of the exemplary semiconductor structure of FIG. 12 after formation of a plurality of conductive metal lines.

Referring now to FIG. 13, there is illustrated the exemplary semiconductor structure of FIG. 12 after formation of a plurality of metal lines 38. The plurality of metal lines 38 are located above each fin structure of the plurality of fin structures 20 and straddle each functional gate structure (34, 36). Each metal line 38 is orientated perpendicular to each functional gate structure (34, 36) and has a bottommost surface that is in direct physical contact with a portion of a topmost surface of each second doped semiconductor portions 16P. Within the drawing, element 40 highlight areas of such contact. Each metal line 38 is located directly above and runs parallel with a column of fin structures 20.

Each metal line 38 represents a bitline of the semiconductor structure of the present application, each gate conductor portion 36 of each functional gate represents a word line of the semiconductor structure of the present application, and each first doped semiconductor portion 12P represents a buried bitline of the semiconductor structure of the present application.

Each metal line 38 can be formed by depositing a conductive metal on the structure shown in FIG. 12. The conductive metal can be deposited utilizing one of the deposition processes mentioned above in forming the gate conductor portion 36. After deposition, a patterning process such as, for example, lithography and etching, can be used to pattern the conductive metal and to provide each metal line 38. The conductive metal that provides each metal line 38 can be selected from one of aluminum, copper and tungsten. Typically, the conductive metal that provides the metal lines 38 is comprised of copper or a copper containing alloy such as, for example, a copper-aluminum alloy. In some embodiments, each metal line 38 can be embedded within an interconnect dielectric material. In such a process, a single damascene or dual damascene process can be used.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of first doped semiconductor portions of a first conductivity type located on a topmost surface of a bulk semiconductor substrate;
a plurality of fin structures extending upwards from a surface of each of said first doped semiconductor portions, wherein each fin structure of said plurality of fin structures includes from bottom to top, a non-doped semiconductor portion and a second doped semiconductor portion of said first conductivity type;
a trench isolation structure located between each first doped semiconductor portion, wherein said trench isolation structure has an upper portion in contact with a sidewall of said first doped semiconductor portion and a lower portion that is confined entirely within a doped region that is present in said bulk semiconductor substrate, wherein said doped region is of a second conductivity type that is opposite to said first conductivity type and wherein a portion of said doped region contacts each sidewall surface of said trench isolation structure and a bottommost surface of said first doped semiconductor portion;
a trapping material layer in direct physical contact with an entire exposed bottom portion of vertical sidewall surfaces of each non-doped semiconductor portion of each fin structure and in direct physical contact with an entire exposed topmost surface of each first doped semiconductor portion and an entire exposed topmost surface of each trench isolation structure, said trapping material layer having a topmost surface that is located beneath a topmost surface of said non-doped semiconductor portion of each of said fin structures;
a plurality of functional gate structures straddling over each fin structure of said plurality of fin structures; and
a plurality of metal lines located above each fin structure of the plurality of fin structures and straddling each functional gate structure of said plurality of functional gate structures, wherein each metal line is orientated perpendicular to each functional gate structure and has a bottommost surface that is in direct physical contact with a portion of a topmost surface of each of said second doped semiconductor portions.

2. The semiconductor structure of claim 1, wherein said trapping material layer is an electron-trapping material.

3. The semiconductor structure of claim 1, wherein said first conductivity type is p-type, and said first doped semiconductor portion, said non-doped semiconductor portion, and said second doped semiconductor portion each comprise silicon.

4. The semiconductor structure of claim 1, wherein said first conductivity type is n-type, and said first doped semiconductor portion, said non-doped semiconductor portion, and said second doped semiconductor portion each comprise silicon.

5. The semiconductor structure of claim 1, wherein said trench isolation structure has a topmost surface that is coplanar with a topmost surface of each first doped semiconductor portion.

6. The semiconductor structure of claim 1, wherein each first doped semiconductor portion has an epitaxial relationship with said bulk semiconductor substrate, each non-doped semiconductor region has an epitaxial relationship with said first doped semiconductor portion, and each second doped semiconductor portion has an epitaxial relationship with said non-doped semiconductor portion.

7. The semiconductor structure of claim 1, wherein said sidewall surfaces of said non-doped semiconductor portion are vertically coincident with sidewall surfaces of said second doped semiconductor portion.

8. The semiconductor structure of claim 1, wherein each functional gate structure includes a gate dielectric material portion and a gate conductor portion, and wherein said gate dielectric material portion is in direct physical contact with sidewalls of each fin structure and in direct physical contact with another portion of said second doped semiconductor portion of each fin structure.

9. The semiconductor structure of claim 8, wherein a portion of said gate dielectric material portion is located on a surface of said trapping material layer.

10. The semiconductor structure of claim 1, wherein said metal lines include a conductive metal selected from one of aluminum, copper and tungsten.

* * * * *